(12) United States Patent
Hayashi

(10) Patent No.: US 7,355,342 B2
(45) Date of Patent: Apr. 8, 2008

(54) ORGANIC EL DEVICE AND ELECTRONIC APPARATUS CAPABLE OF PREVENTING A SHORT CIRCUIT

(75) Inventor: Kanji Hayashi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/354,150

(22) Filed: Feb. 15, 2006

(65) Prior Publication Data

US 2006/0202611 A1     Sep. 14, 2006

(30) Foreign Application Priority Data

Mar. 11, 2005  (JP)  ............................. 2005-068693

(51) Int. Cl.
*H05B 33/26* (2006.01)
*H05B 33/00* (2006.01)

(52) U.S. Cl. ..................... 313/506; 313/504; 313/500; 313/505; 428/690; 428/917

(58) Field of Classification Search ................. 313/501, 313/504, 505, 506; 257/40, 88
See application file for complete search history.

(56) References Cited

U.S. PATENT DOCUMENTS

| | | | | |
|---|---|---|---|---|
| 6,642,544 | B1 * | 11/2003 | Hamada et al. | 257/88 |
| 6,713,955 | B1 * | 3/2004 | Roitman et al. | 313/504 |
| 7,199,516 | B2 * | 4/2007 | Seo et al. | 313/504 |
| 2004/0227459 | A1 * | 11/2004 | Imura | 313/504 |
| 2005/0001542 | A1 * | 1/2005 | Kiguchi | 313/504 |
| 2005/0023971 | A1 * | 2/2005 | Furugori et al. | 313/506 |

FOREIGN PATENT DOCUMENTS

JP      A-2001-230086      8/2001

* cited by examiner

*Primary Examiner*—Sikha Roy
(74) *Attorney, Agent, or Firm*—Oliff & Berridge, PLC

(57) ABSTRACT

An organic EL device includes first electrodes, wiring lines that drive the first electrode, second electrodes that each has a high resistance portion having a resistance higher than other portions, at least a part of the high resistance portion being arranged to overlap the wiring line in plan view, and a light-emitting layer that is interposed between the first and second electrodes.

10 Claims, 8 Drawing Sheets

RELATED ART

ORGANIC EL DEVICE AND ELECTRONIC APPARATUS CAPABLE OF PREVENTING A SHORT CIRCUIT

The entire disclosure of Japanese Patent Application No. 2005-068693, filed Mar. 11, 2005 is expressly incorporated by reference herein.

BACKGROUND

1. Technical Field

The present invention relates to an organic EL device and to an electronic apparatus.

2. Related Art

An organic electroluminescent (EL) device is expected as a next-generation display device.

FIG. 9 is an explanatory diagram of an organic EL device according to a related art. FIG. 9A is a plan view, and FIG. 9B is a side sectional view taken along line IXB-IXB of FIG. 9A. As shown in FIG. 9A, a typical organic EL device includes a plurality of organic EL elements 3 which are arranged in a matrix. In more detail, as shown in FIG. 9B, a driving circuit 5 is provided on a glass element substrate 2, and the organic EL element 3 is provided on the driving circuit 5. The organic EL element 3 includes a pixel electrode 23 as an anode, an organic functional layer (a hole injection layer, a light-emitting layer 60, or an electronic transport layer), and a cathode 50, which are sequentially laminated. Current is supplied to the organic functional layer by using the pixel electrode 23 and the cathode 50 such that the light-emitting layer 60 can emit light.

A plurality of power lines 8 are provided on the driving circuit 5. The power lines 8 supply current from the periphery of the element substrate 2 to the pixel electrode 23. As shown in FIG. 9A, since a plurality of organic EL elements 3 are arranged in a matrix, a significant voltage drop due to the wiring line resistance of the power lines 8 occurs in the organic EL elements 3 located in a central portion of the substrate. The power lines 8 are arranged in a lattice shape to prevent the voltage drop due to the line resistance. In addition, it is possible to supply current to each organic EL element 3 using each of the power lines 8.

As shown in FIG. 9B, the power lines 8 are arranged around the organic EL element 3. The cathode 50 of the organic EL element 3 is provided on the entire surface of the substrate 2. The organic EL element is a current-controlled element. Since a large current flows in the cathode 50 so as to obtain sufficient luminance, a short circuit may occur in a portion between the power lines 8 and the cathode 50, which is denoted by an arrow 55. If the short circuit occurs in the portion between the power lines 8 and the cathode 50, a large current flows in the portion, such that the driving circuit is burned and causes short circuits to consecutively occur in adjacent portions. As shown in FIG. 9A, since the power lines 8 are formed in a lattice shape, a short circuit occurs in the entire substrate.

In the organic EL device according to a related art, the cathode has a low resistance so as to reduce a voltage drop due to the surface resistance of the cathode (refer to JP-A-2001-230086). In this configuration, since the current flowing in the cathode increases, a short circuit in the power lines is likely to occur.

SUMMARY

An advantage of some aspects of the invention is that it provides an organic EL device capable of preventing a short circuit from consecutively occurring, and a reliable electronic apparatus.

According to an aspect of the invention, there is provided an organic EL device including: first electrodes; wiring lines that drive the first electrode; second electrodes that each has a high resistance portion having a higher resistance than other portions, and at least a part of the high resistance portion being arranged to overlap the wiring line in plan view, a light-emitting layer that is interposed between the first and second electrodes.

The term "in plan view" means that it is viewed from a direction perpendicular to a surface of the electrode or the like.

According to the aspect of the invention, even though a short circuit occurs in portions between the wiring lines and the second electrodes and a large current flows in the portions, it is possible to prevent the short circuit from consecutively occurring along the wiring lines. In addition, since the high resistance portion is provided on a part of the second electrode, the emission capability of the organic EL device is not lowered.

The wiring lines may be arranged in a lattice shape.

In this case, it is possible to prevent short circuit from consecutively occurring along the wiring lines.

The plurality of light-emitting layers may be arranged while the second electrode may include the plurality of high resistance portions. A plurality of the high resistance portions are provided at the same pitches as those of the plurality of light-emitting layers and are arranged around the light-emitting layers.

Accordingly, it is possible to prevent short circuit from consecutively occurring.

The high resistance portions may be arranged so as to overlap intersection portions of the wiring lines arranged in a lattice shape in plan view.

The intersection portions of the wiring lines are likely to be short-circuited since the wiring lines are stacked such that the distance between the second electrode is decreased.

The high resistance portion may be formed by opening the second electrode.

Accordingly, it is possible to simplify the manufacturing process as compared to a case where the second electrode is made thin to form the high resistance portion. In this case, the high resistance portion is provided around the light-emitting layer, thus, the emission capability of the organic EL device is not lowered.

The plurality of light-emitting layers may be arranged while the second electrode may include the plurality of high resistance portions. The plurality of high resistance portions are arranged at pitches different from those of the plurality of light-emitting layers.

According to this configuration, it is not necessary to accurately position the high resistance portion to the light-emitting layer, it is possible to simplify the manufacturing process.

The plurality of high resistance portions may be provided extending in a direction that intersects in a direction in which the plurality of light-emitting layers extend.

The high resistance portions and the wiring lines overlap each other in a lot of portions in plan view. Accordingly, it is possible to prevent short circuits from consecutively occurring.

At least a portion other than the high resistance portion in the second electrode may include a material having a positive temperature coefficient.

Even though the wiring line and the second electrode are short-circuited, it is possible to increase an electrical resistance as the ambient temperature increases, thereby preventing short circuits from consecutively occurring.

According to another aspect of the invention, there is provided an electronic apparatus including the organic EL device according to a first aspect of the invention.

According to this configuration, the electronic apparatus includes the organic EL device capable of preventing short circuits from consecutively occurring. Accordingly, it is possible to provide a reliable electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
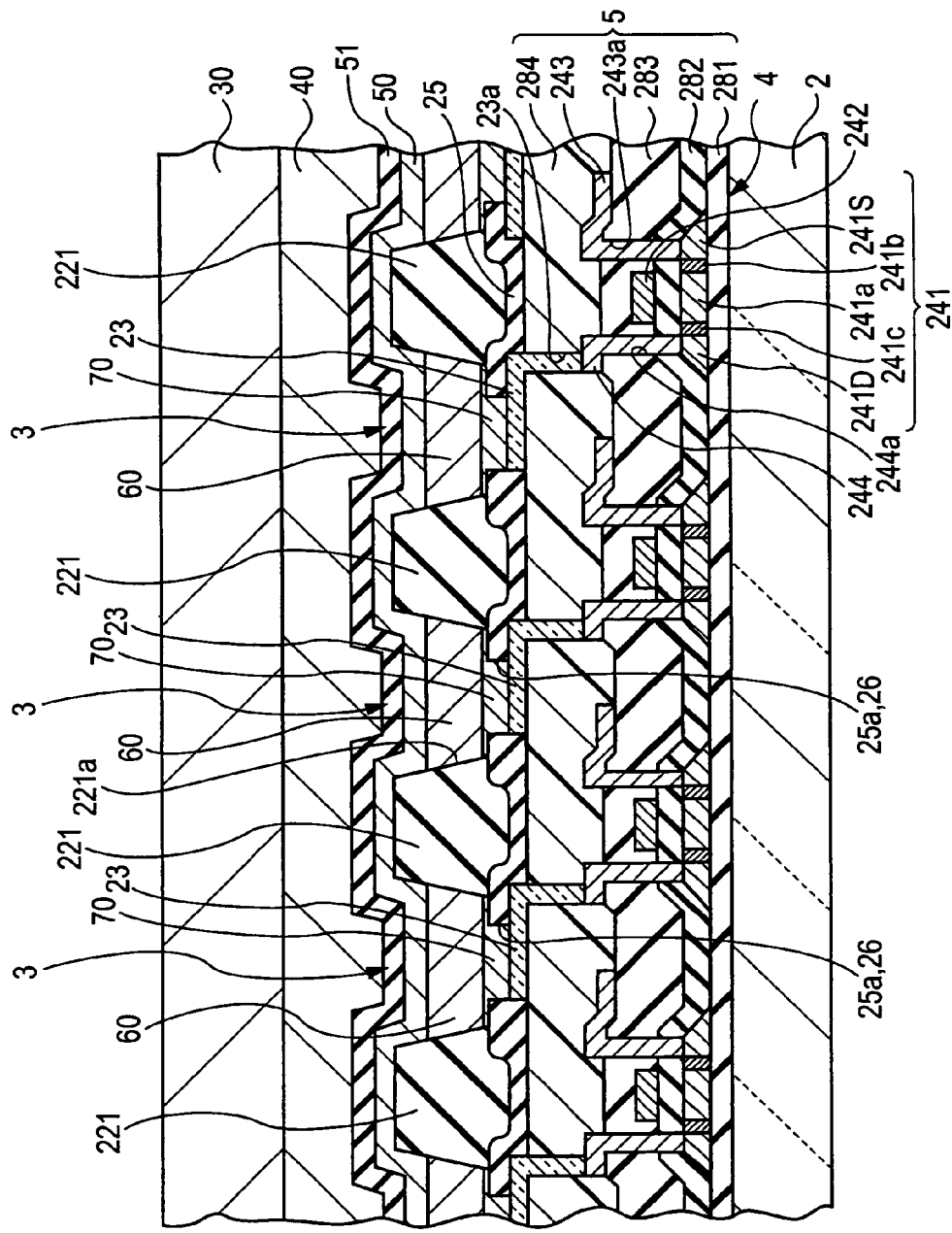
FIG. 1 is a side sectional view of a typical organic EL device.

Exemplary embodiments of the invention will now be described with reference to the accompanying drawings. In the drawings, the size of each component is properly altered for easy understanding. The term "in plan view" implies that it is viewed from a direction perpendicular to a substrate.

First Embodiment

An organic EL device according to a first embodiment of the invention will now be described with reference to FIG. 1 or 3.

FIG. 1 is a side sectional view of a typical organic EL device. The organic EL device includes an element substrate 2, a driving circuit 5, which is provided on the element substrate 2, an organic EL element 3, which is provided on a pixel region 26 of the driving circuit 5, and a sealing substrate 30, which seals the organic EL element 3. The organic EL element 3 is formed in a square shape, a circular shape, or an oval shape in plan view, and is arranged on the element substrate 2 in a matrix. In the present embodiment, a bottom emission type organic EL device will be described in which light emitted from the organic EL element 3 is output from the element substrate 2.

Organic EL Device

The bottom emission type organic EL device employs a transparent or a semi-transparent element substrate 2 since light emitted from a light-emitting layer 60 is output from the element substrate 2. For example, the element substrate 2 may be made of glass, quartz, or resin (plastic or plastic film). In particular, it is preferable that the element substrate is made of glass.

The driving circuit 5 including a driving TFT 4 (a driving element 4) for driving the organic EL element 3 is provided on the element substrate 2. In addition, the organic EL device may be configured by mounting a semiconductor element having the driving circuit on the element substrate 2.

Figure 2:
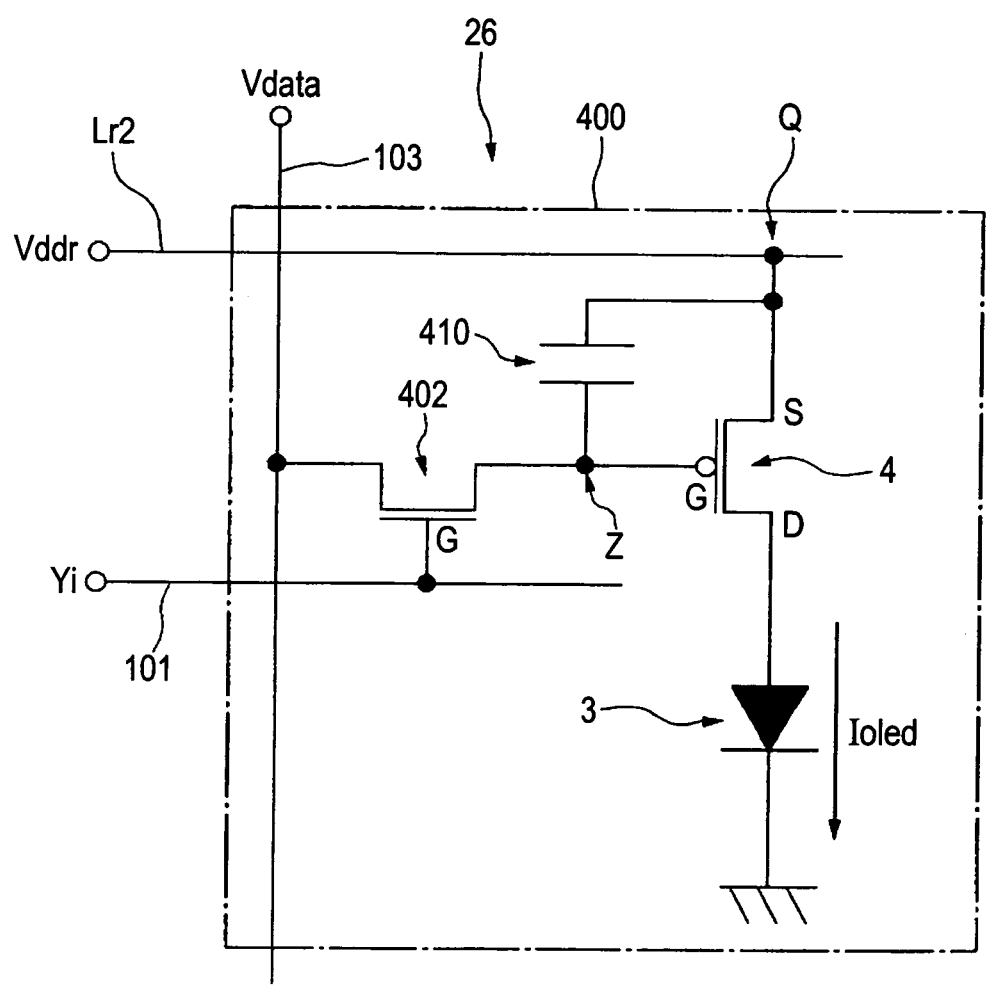
FIG. 2 is a circuit diagram of a pixel circuit.

FIG. 2 is a circuit diagram of a pixel circuit. A pixel circuit 400 is formed in the pixel region 26. The pixel circuit 400 includes two thin film transistors (hereinafter referred to as "TFT") 4 and 402, a capacitor element 410, and an organic EL element 3. A source electrode S of the p-channel TFT 4 is connected to a power line Lr2 at a pixel connection point Q, and its drain electrode D is connected to an anode of the organic EL element 3. The capacitor element 410 is connected between the source electrode S and the gate electrode G of the TFT 4. A gate electrode of the TFT 402 is connected to a scanning line 101, a source electrode is connected to a data line 103, and a drain electrode is connected to a gate electrode of the TFT 4.

In this configuration, when a scanning signal Yi becomes a high level, the n-channel TFT 402 turns ON, such that the voltage at a node Z is equal to a voltage Vdata. At this time, an electrical charge corresponding to Vddr-Vdata is charged on the capacitor element 410. Next, when the scanning signal Yi becomes a low level, the TFT 402 turns OFF. Since an input impedance is very high at the gate electrode of the TFT 4, the electrical charge which is charged on the capacitor element 410 remains unchanged. That is, a gate-source voltage of the TFT 4 is maintained at the voltage Vddr-Vdata at the time when the voltage Vdata is applied. Since a current Ioled at the organic EL element 3 is determined by the gate-source voltage of the TFT 4, the current Ioled flows on the organic EL element 3 according to the voltage Vdata.

Since the magnitude of the current Ioled is determined by the gate-source voltage Vddr-Vdata of the TFT 4, it is important to apply the same voltage Vddr to each pixel circuit 400 in order to obtain a uniform luminance on each organic EL element 3. Accordingly, the present embodiment is configured such that the power lines are arranged in a lattice shape such that the voltage drop due to the wiring line resistance is reduced.

Figure 3:
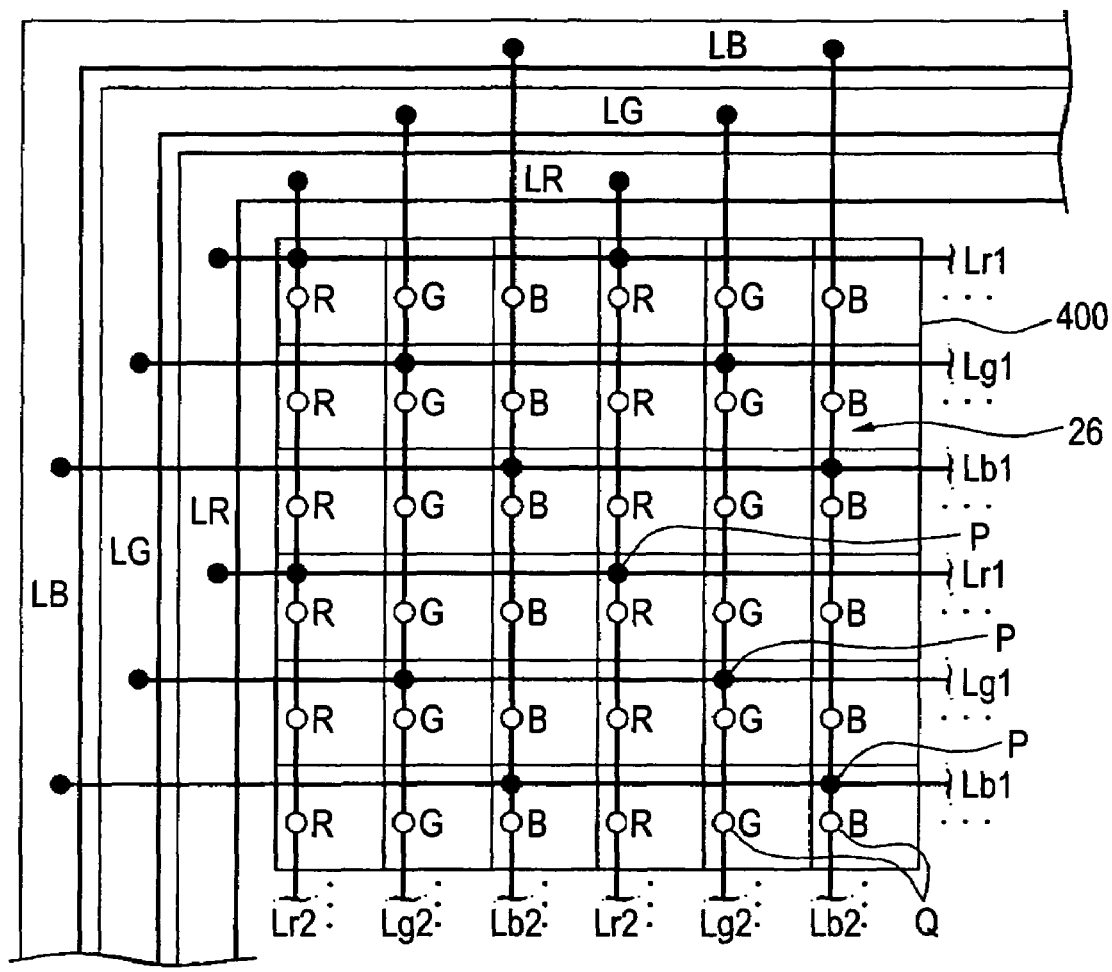
FIG. 3 is a wiring diagram of power lines.

FIG. 3 is a wiring diagram of the power lines. The power lines include main power lines LR, LG, and LB, which are arranged around the element substrate, first sub-power lines Lr1, Lg1, and Lb1, and second sub-power lines Lr2, Lg2, and Lb2. The main power lines LR, LG, and LB are provided corresponding to emission colors of the organic EL elements. The main power lines LR, LG, and LB are provided to correspond to the respective emission colors so as to obtain a uniform luminance by applying a predetermined current to each organic EL element having different emission efficiency with respect to each emission color.

The first sub-power lines Lr1, Lg1, and Lb1 are provided so as to be parallel in a row direction. One end of each of the first sub-power lines Lr1, Lg1, and Lb1 are connected to one side of each of the main power lines LR, LG, and LB, and the other end is extended to the pixel area 26. The second sub-power lines Lr2, Lg2, and Lb2 are provided so as to be parallel in a column direction. One end of each of the second sub-power lines Lr2, Lg2, and Lb2 are connected to each of the main power lines LR, LG, and LB, respectively, and the other end is extended to the pixel area 26. The first sub-power lines Lr1, Lg1, and Lb1, and the second sub-power lines Lr2, Lg2, and Lb2 cross each other within the pixel region. Among them, sub-power lines connected to the same main power lines are connected to each other at a sub-power connection point P (a black circle in the drawing). In addition, the second sub-power lines Lr2, Lg2, and Lb2 and each pixel circuit 400 are connected to each other at a pixel connection point Q (a white circle in the drawing). The pixel connection point Q may be provided at least at one of the first sub-power lines Lr1, Lg1, and Lb1, and the second sub-power lines Lr2, Lg2, and Lb2.

Accordingly, since the power lines are arranged in a lattice shape, it is possible to considerably reduce the wiring line resistance. As a result, it is possible to uniformly supply the power voltages Vddr, Vddg, and Vddb of the main power lines LR, LG, and LB to each pixel circuit 400, thereby greatly improving luminance deviation and color stain.

Returning to FIG. 1, components provided in the vicinity of the TFT 4 will now be described in detail. A base protection layer 281 made of an insulating material is provided on the element substrate 2. A silicon layer 241, which is a semiconductor material, is formed thereon. A gate insulation layer 282, which is mainly made of $SiO_2$ or SiN, is formed on the silicon layer 241. A gate electrode 242 is formed on the gate insulation layer 282. The gate electrode 242 forms a part of a scanning line (not shown). A channel region 241a of the silicon layer 241 is a region which faces the gate electrode 242 through the gate insulation layer 282 interposed therebetween. A first interlayer insulation layer 283, which is mainly made of $SiO_2$, is formed on a surface of the gate electrode 242 and the gate insulation layer 282.

A lightly-doped source region 241b and a heavily-doped source region 241S are provided on one side of the channel region 241a of the silicon layer 241. On the other side of the channel region 241a, a lightly-doped drain region 241c and a heavily-doped drain region 241D are provided. As a result, the TFT 4 having a so-called LLD (Light Doped Drain) structure is formed.

The heavily-doped source region 241S is connected to the source electrode 243 by a contact hole 243a formed through the gate insulation layer 282 and the first interlayer insulation layer 283. The source electrode 243 forms a part of the power lines. The heavily-doped drain region 241D is connected to the drain electrode 244, which is disposed on the same layer as the source electrode 243, by a contact hole 244a formed through the gate electrode 282 and the first interlayer insulation layer 283.

A planarization film 284 made of a heat-resisting insulating resin, such as an acrylic resin or a polyimide resin, is provided on the source electrode 243, the drain electrode 244, and the first interlayer insulation layer 283. The planarization film 284 is formed to remove the uneven surface of the TFT 4, the source electrode 243, or the drain electrode 244.

A plurality of pixel electrodes 23 are formed on a surface of the planarization film 284. The pixel electrodes 23 are arranged on the surface of the planarization film 284 in a matrix. The pixel electrode 23 is connected to the drain electrode 244 by the contact hole 23a formed in the planarization film 284. That is, the pixel electrode 23 is connected to the heavily-doped drain region 241D of the silicon layer 241 through the drain electrode 244.

In addition, an inorganic wall 25 made of an inorganic insulating material such as $SiO_2$ is formed around the pixel electrode 23 on the planarization film 284. An organic wall 221 made of an organic insulating material such as polyimide is formed on a surface of the inorganic wall 25. A side 25a of the inorganic wall 25 and a side 221a of the organic wall 221 are disposed on an upper side of the pixel electrode 23, which is formed in a region in which the organic EL element 3 is formed.

A plurality of organic functional layers are stacked inside both the side 25a of the inorganic wall 25 and the side 221a of the organic wall 221, thereby forming the organic EL element 3. The organic EL element 3 includes the pixel electrode (first electrode) 23, which acts as an anode, a hole injection layer 70, which injects/transports holes from the pixel electrode 23, a light-emitting layer 60, which is made of an organic EL material, and a cathode (second electrode) 50.

In the bottom emission type organic EL device, the pixel electrode 23 acting as an anode is made of a transparent conductive material such as ITO (Indium Tin Oxide).

The hole injection layer 70 is preferably made of a dispersed solution of 3,4-polyethylene dioxythiophene/polystyrene sulfonate (PEDOT/PSS), i.e., it is preferable that the dispersed solution is obtained by dispersing the 3,4-polyethylene dioxythiophene in the polystyrene sulfonate as a dispersion solvent and dispersing them in water.

In addition, the hole injection layer 70 is not limited described-above and may be made by dispersing, for example, polystyrene, polypyrrole, polyaniline, polyacetylene, or their derivatives in a dispersion solvent such as polystyrene sulfonate.

The light-emitting layer 60 is made of an emission material which can emit fluorescence or phosphorescence. In more detail, examples of the emission material include (poly)fluorene derivative (PF), (poly)para-phenylenevinylene derivative (PPV), polyphenylene derivative (PP), polypara-phenylene derivative (PPP), polyvinyl carbazole (PVK), polythiophen derivative, and polysilane such as polymethylphenylsilane (PMPS). Further, in addition to the high molecular materials, high molecular materials, such as perylene coloring agent, coumarin coloring agent, or rhodamine coloring agent, and low molecular materials, such as rubrene, perylene, 9,10-diphenylanthracene, tetraphenylbutadien, nile red, coumarin 6, or quinacridone, may be doped.

The cathode 50 includes a main-cathode and a sub-cathode, which are stacked. Ca, Mg, or LiF, which has a work function below 3.0 eV, is preferred as the main-cathode. Accordingly, since the main-cathode acts as an electron injection layer, it is possible to make a light-emitting layer emit light at a low voltage. The sub-cathode acts to improve the conductivity of the entire cathode and protect the main-cathode from oxygen or water. Accordingly, a metallic material, such as Al, Au, or Ag, which has a high conductivity, is preferred as the sub-cathode.

An inorganic sealing film 51 made of $SiO_2$ is formed on the cathode 50. A sealing substrate 30 is joined to an upper side of the inorganic sealing film 51 through an adhesion layer 40. A sealing cap covering the entire cathode 50 may be fixed to the periphery of the element substrate 2, and a getter agent which absorbs water or oxygen may be provided inside the sealing cap.

In the above-mentioned organic EL device, an image signal is applied to the pixel electrode 23 through the TFT 4 at a predetermined timing. A hole, which is injected from the pixel electrode 23, and an electron, which is injected from the cathode 50, recombine with the light-emitting layer 60 to emit light at a predetermined wavelength. The light transmits the pixel electrode 23, which is made of a transparent material, the driving circuit 5, and the element substrate 2, to be output to the outside, such that an image is displayed on the element substrate side. Since the inorganic wall 25 is made of an insulating material, current flows only on the inside of the side 25a of the inorganic wall 25, such that the light-emitting layer 60 emits light. Thus, the inside of the side 25a of the inorganic wall 25 becomes the pixel area 26 of the organic EL device.

High Resistance Portion

Figure 4:
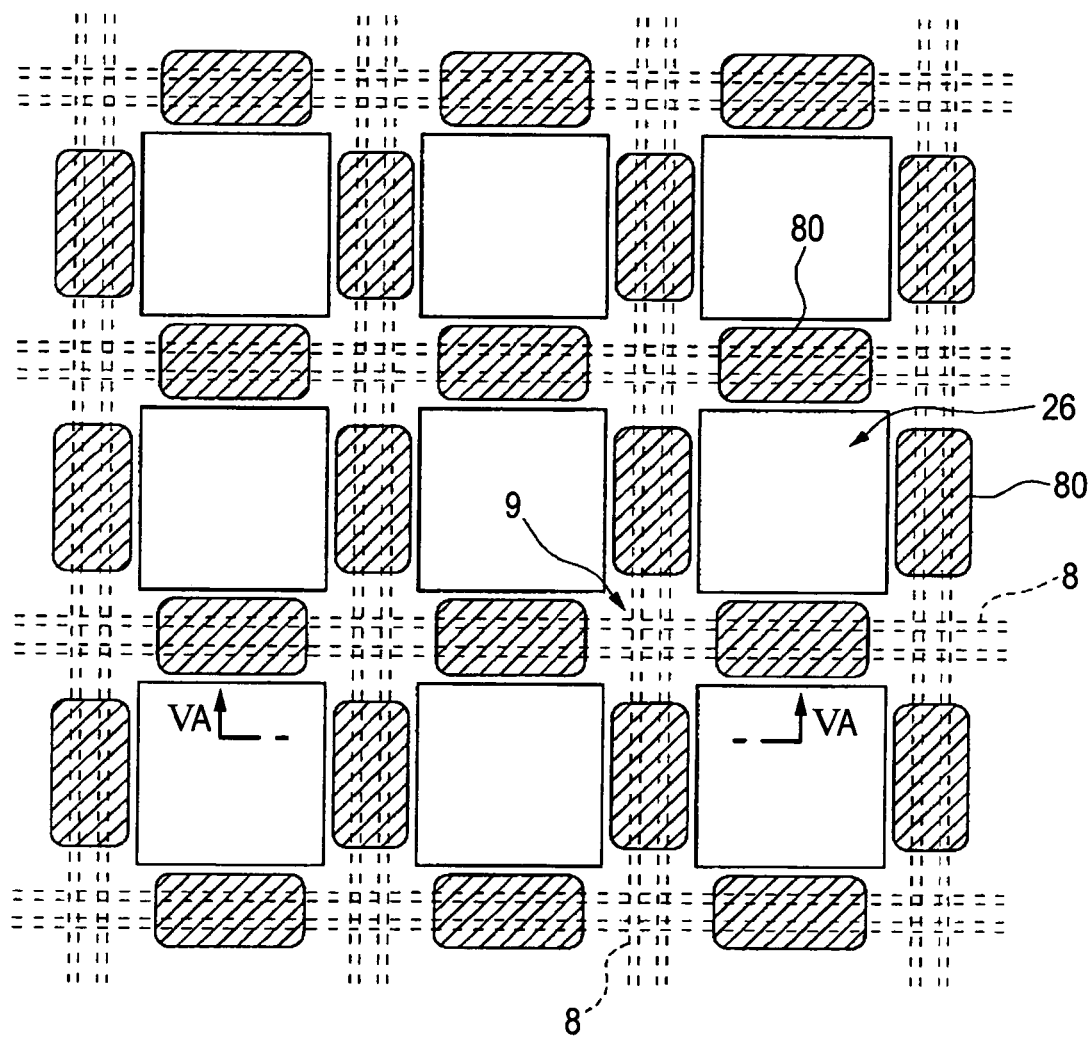
FIG. 4 is a plan view of an organic EL device according to a first embodiment of the invention.

FIG. 4 is a plan view of the organic EL device according to the first embodiment of the invention. The organic EL device according to the first embodiment includes a high resistance portion 80 on the above-mentioned cathode. The high resistance portion 80 has a higher resistance than other portions of the cathode. The high resistance portion 80 has a square shape in plan view, and is provided to overlap the power lines 8 embedded in the driving circuit in plan view. The power lines 8 are arranged in a lattice shape around the pixel region 26 arranged in a matrix in order to prevent an aperture ratio from being reduced in the bottom emission type organic EL device. The high resistance portions 80 are arranged around the pixel region 26 so as to correspond to the plurality of pixel regions 26. That is, each high resistance portion 80 is provided between the pixel regions 26 which are provided adjacently in the lengthwise and widthwise directions.

Figure 5A:
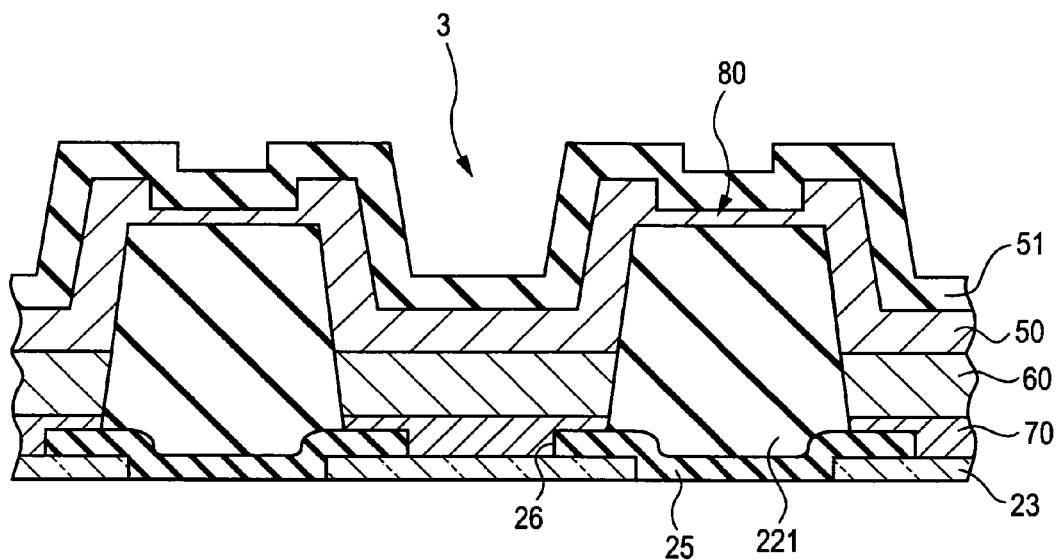
FIG. 5A is a side sectional view of an organic EL device according to a first embodiment of the invention.

FIG. 5A is a side sectional view taken along line VA-VA of FIG. 4. As shown in FIG. 5A, the high resistance portion 80 of the cathode 50 is thinner than other portions (hereinafter referred to as 'low resistance portion') of the cathode 50. In more detail, while the low resistance portion is 300~400 nm thick, the high resistance portion 80 is 50~100 nm thick. Thus, the high resistance portion can have a higher resistance than the low resistance portion. It is preferred that the high and low resistance portions are formed by changing the thickness of the sub-cathode among the main cathode and sub-cathodes constituting the cathode 50, since it is possible to make the resistance of the high resistance portion 80 higher than that of the low resistance portion by changing the thickness of the sub-cathode having a good conductivity.

It is preferred that the sub-cathode includes a material having a positive temperature coefficient. The material having a positive temperature coefficient implies a material whose resistance increases as the temperature increases. For example, Ni is one of the materials. In this case, even though the power lines 8 and the cathode are short-circuited, it is possible to increase the electrical resistance as the ambient temperature rises. Accordingly, it is possible to prevent short circuits from consecutively occurring.

Method of Manufacturing Organic EL Device

A method of manufacturing an organic EL device according to the first embodiment of the invention will now be described with reference to FIG. 5A. First, the driving circuit (not shown) is formed on the element substrate. The pixel electrodes 23 are formed on the driving circuit in a matrix. The inorganic wall 25 and the organic wall 221 are formed around the pixel electrode 23. The organic functional layer such as the hole injection layer 70 or the light-emitting layer 60 is formed on an opening of the inorganic wall 25 and the organic wall 221. The organic functional layer is preferably formed using a liquid process, such as inkjet method, and a decompression drying process. In this case, it is preferred that, before forming the organic functional layer, the surface of the pixel electrode 23 is subjected to a lyophilic process and, at the same time, the side of and the upper surface of the organic wall 221 are subjected to a lyophobic process.

Next, the cathode 50 is formed by a deposition method or a sputtering method. In more detail, a main-cathode is first formed on the entire surface of the element substrate. A lower-layer sub-cathode is formed on the entire surface of the main-cathode. The thickness of the lower-layer sub-cathode is formed so that the high resistance portion 80 can be formed by the main-cathode and the lower-layer sub-cathode, which are stacked. An upper-layer sub-cathode is formed on the lower-layer sub-cathode by depositing the upper-layer sub-cathode using a hard mask that shields the high resistance portion 80. The thickness of the upper-layer sub-cathode is formed so that the low resistance portion can be formed by the main-cathode, the lower-layer sub-cathode, and the upper-layer sub-cathode, which are stacked. The hard mask which shields the high resistance portion 80 will be described in detail in a second embodiment. As a result, the cathode 50 which includes the high resistance portion 80 and the low resistance portion is formed. Next, an inorganic sealing film 51 is formed on the cathode 50.

Figure 5B:
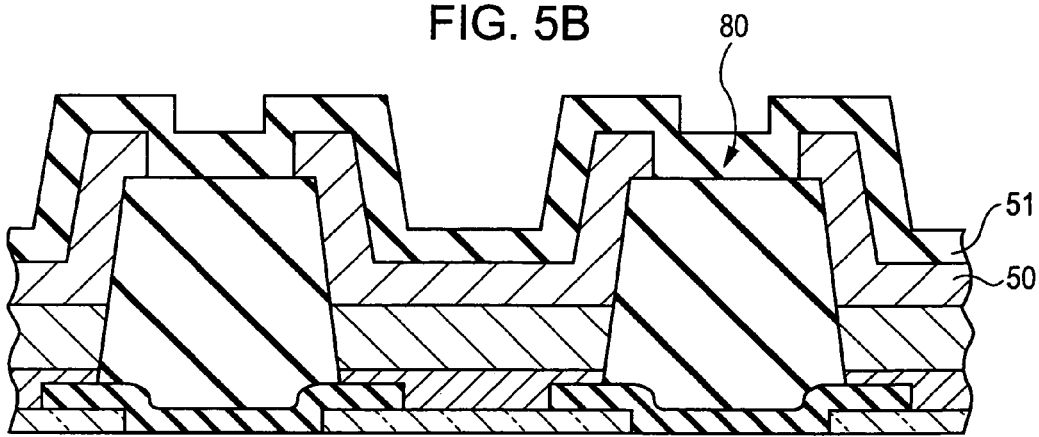
FIG. 5B is a side sectional view of an organic EL device according to a first embodiment of the invention.

FIG. 5B is a side sectional view of a modified example of the organic EL device according to the first embodiment of the invention. In the modified example, the cathode 50 is opened to form the high resistance portion 80. The inorganic sealing film 51 made of an insulating material such as $SiO_2$ is filled in the opening of the cathode 50. In order to form the high resistance portion 80, the main-cathode and the sub-cathode may be sequentially formed on the element substrate using the hard mask that shields the high resistance portion 80. Accordingly, since it is possible to reduce the number of times the deposition process is performed, it is possible to simplify the manufacturing process. In this case, since the high resistance portion 80 is arranged around the pixel region, it is possible to prevent the emission capability of the organic EL element from deteriorating.

Figure 9A:
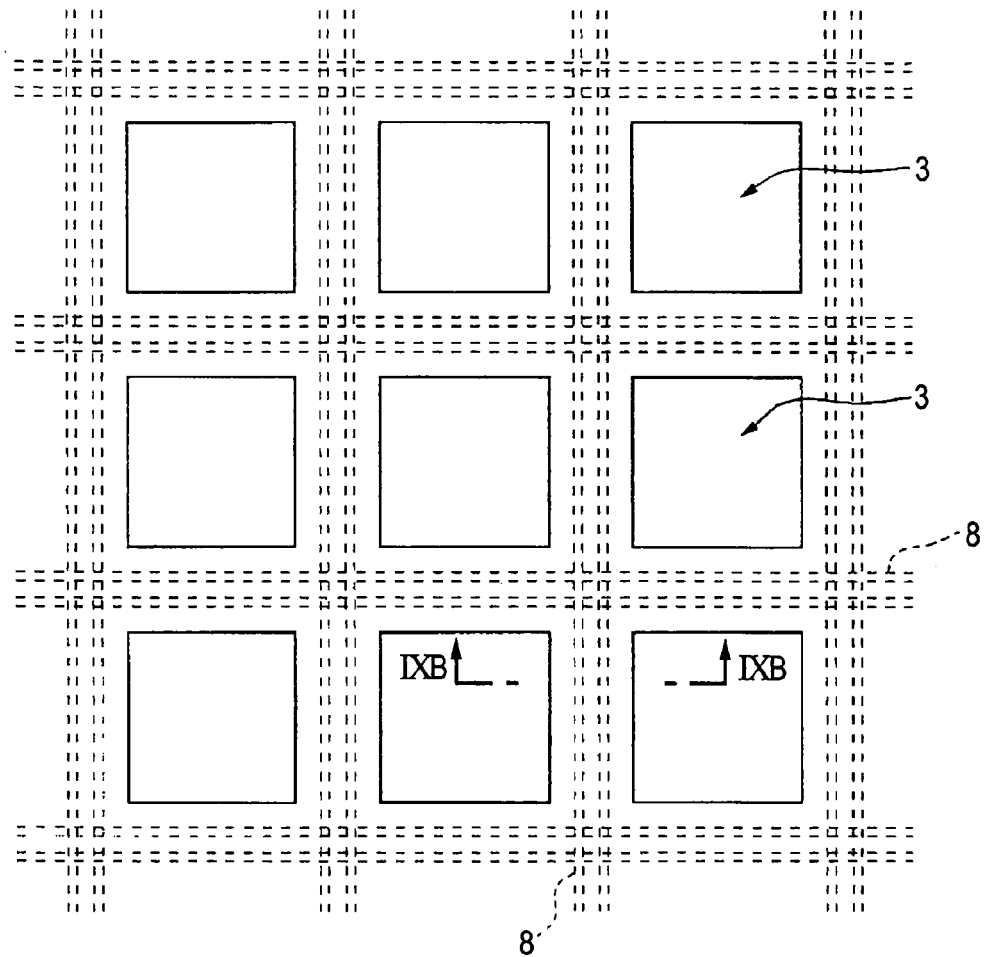
FIG. 9A is an explanatory diagram of an organic EL device according to a related art.
Figure 9B:
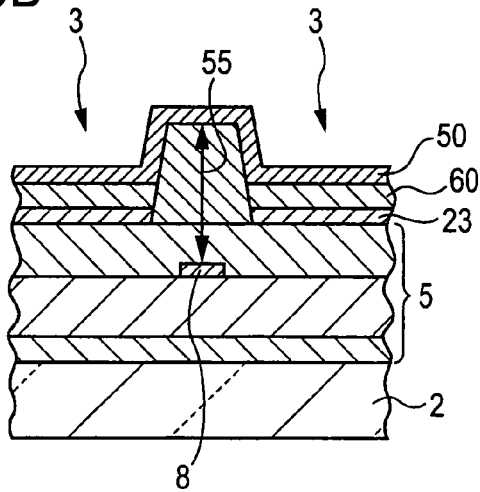
FIG. 9B is an explanatory diagram of an organic EL device according to a related art.

Operation of the organic EL device according to the first embodiment of the invention will now be described. The organic EL element is a current-controlled element. Since a large current flows in the cathode so as to obtain a sufficient luminance, a short circuit may occur in a portion between the power lines 8 and the cathode 50, which is denoted by an arrow 55 of FIG. 9B. Once the short circuit occurs in the portion, a large current flows in the portion, such that the driving circuit is burned and short circuits occur consecutively in adjacent portions. As shown in FIG. 9A, since the power lines 8 are formed in a lattice shape, a short circuit occurs in the entire substrate.

The organic EL device according to the present embodiment shown in FIG. 4 is configured such that the high resistance portion 80 is provided on a part of the cathode and overlaps the power lines 8 arranged in a lattice shape in plan view. In this case, even though the power lines 8 and the cathode are short-circuited and large current flows between them, the current does not flow in the high resistance portion 80, thereby preventing short circuits consecutively occurring. Further, since the plurality of high resistance portions 80 is arranged around the pixel regions 26 and is provided at pitches at which the pixel regions 26 are provided, it is possible to prevent short circuits from consecutively occurring. Accordingly, it is possible to prevent overheating due to the short circuit, and to achieve a reliable organic EL device.

In the first embodiment, the high resistance portions 80 are arranged between the pixel regions 26 which are adjacent to each other in a lengthwise or widthwise direction. In this case, the high resistance portion 80 is arranged to overlap the power lines 8 extending in a lengthwise or widthwise direction in plan view. The high resistance portion may be provided to overlap an intersection part 9 between the power lines 8 arranged in a lattice shape in plan view. The power lines 8 are stacked on the intersection part 9 between the power lines 8, such that the distance with the cathode decreases, and the power lines 8 and the cathode are likely to be short-circuited. Accordingly, it is possible to prevent short circuits from consecutively occurring by providing the high resistance portion to overlap the intersection part 9 in plan view.

Second Embodiment

An organic EL device according to a second embodiment of the invention will now be described with reference to FIGS. 6 and 7.

Figure 6:
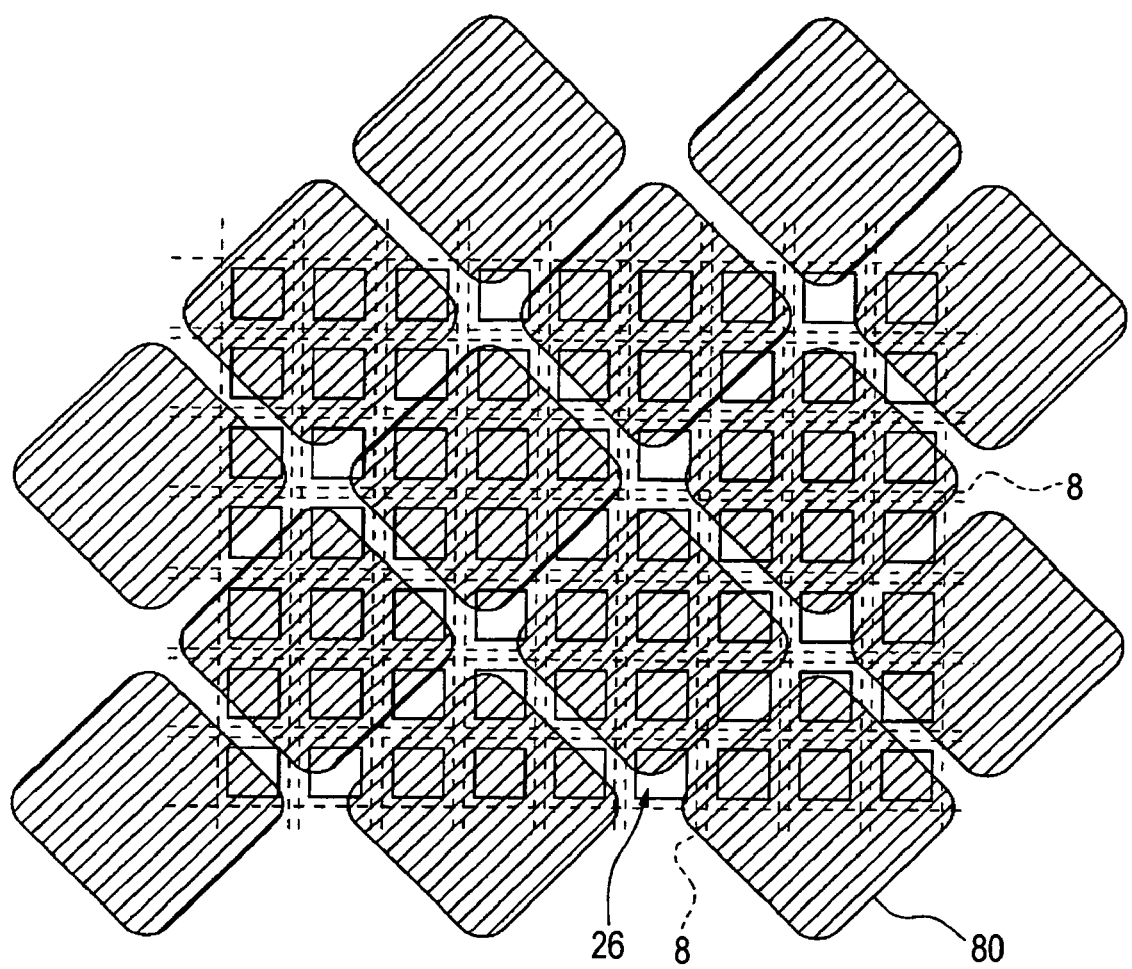
FIG. 6 is a plan view of an organic EL device according to a second embodiment of the invention.

FIG. 6 is a plan view of the organic EL device according to the second embodiment. The organic EL device according to the second embodiment is different from the organic EL device according to the first embodiment in that a plurality of high resistance portions 80 are arranged at pitches different from those of the pixel regions 26. The same components as those of the first embodiment will not be described herein.

A plurality of high resistance portions 80 are also provided on the cathode of the organic EL device according to the second embodiment. The high resistance portion 80 has a square shape which is larger in area than the pixel region 26. That is, in the second embodiment, the plurality of high resistance portions 80 are provided at pitches different from those of the plurality of pixel regions 26. Like the first embodiment, the power lines 8 are arranged in a lattice shape around the pixel region 26. At least part of the high resistance portion 80 is arranged to overlap the power lines 8 embedded in the driving circuit in plan view. Since the high resistance portions 80 are arranged in a direction intersecting with the pixel regions 26, the high resistance portions 80 and the power lines 8 overlap each other in plan view. Accordingly, it is possible to prevent short circuits from consecutively occurring.

In the second embodiment, the high resistance portions 80 and the pixel regions 26 overlap each other in plan view. However, since the low resistance portions are provided in a network shape around the high resistance portions that is provided in an island shape, it is possible to supply current required for driving the pixel regions to each high resistance portion. Accordingly, the emission capability of the organic EL device will not be lowered.

Like the first embodiment, the thickness of the high resistance portion 80 of the cathode is thinner than that of the low resistance portion of the cathode. In order to provide such a cathode, a main-cathode is first formed on the entire surface of the element substrate. Next, a lower-layer sub-cathode is formed on the entire surface of the main-cathode. The thickness of the lower-layer sub-cathode is formed so that the high resistance portion 80 can be formed by the main-cathode and the lower-layer sub-cathode, which are stacked. Next, an upper-layer sub-cathode is formed on the lower-layer sub-cathode by depositing the upper-layer sub-cathode using a hard mask that shields the high resistance portion 80. The thickness of the upper-layer sub-cathode is formed so that the low resistance portion can be formed by the main-cathode, the lower-layer sub-cathode, and the upper-layer sub-cathode, which are stacked.

Figure 7:
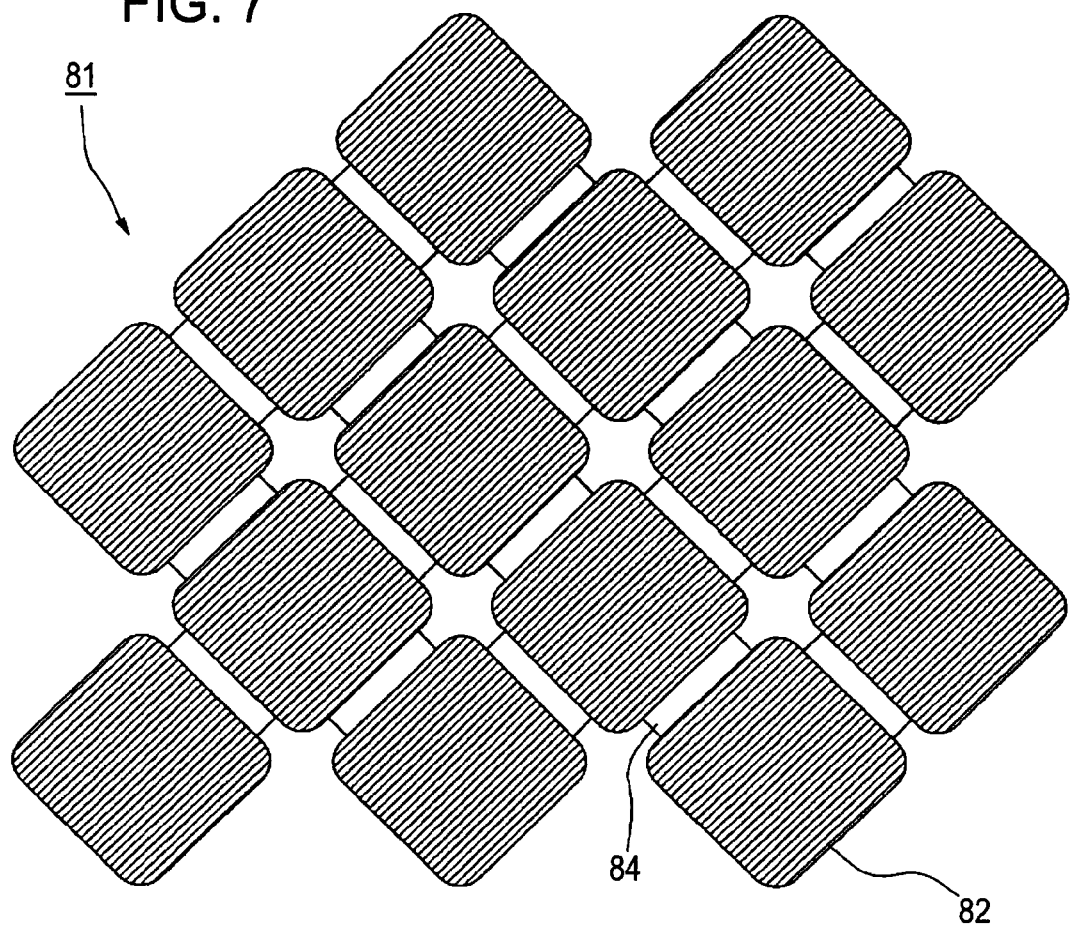
FIG. 7 is a plan view of a hard mask that shields a high resistance portion.

FIG. 7 is a plan view of a hard mask that shields a high resistance portion. Since the high resistance portion of a cathode is formed in an island shape, a shielding portion 82 of the high resistance portion is isolated in the hard mask 81. Thus, the hard mask 81 is configured by connecting a plurality of shielding portions 82 to one another using fine connecting members 84. The hard mask 81 is provided on a surface of the element substrate. In the second embodiment, since the high resistance portions are formed at pitches different from those of the pixel regions, it is not necessary to accurately position the hard mask 81 to the element substrate. Next, the upper-layer sub-cathode is formed by a vapor deposition method or a sputtering method. In this case, since deposited particles are shielded by the shielding portions 82, thus, the deposited particles are attached only to the low resistance portions instead of the high resistance portions. Even though the connecting members 84 are provided in the low resistance portions, the deposited particles can be attached even in the rear side of the connecting members 84 since the hard mask 81 is provided at a short distance from the element substrate. In addition, even though the thickness of the low resistance portion is formed to be thin at a position of the connecting member 84, the emission capability of the organic EL device is not reduced. Further, even though the contour of the high resistance portion is not clear, it does not have an effect on the emission capability of the organic EL device.

As a result, the cathode including the high resistance portion 80 and the low resistance portion shown in FIG. 6 is configured.

In the organic EL device in FIG. 6 according to the second embodiment, at least a part of the high resistance portion overlaps with the power lines 8 in plan view. Accordingly, even though the power lines 8 and the cathode are short-circuited, a large current does not flow in the high resistance portion 80. Accordingly, it is possible to prevent short circuits from consecutively occurring due to the power lines 8. In the second embodiment, since the high resistance portions are provided at pitches different from those of the pixel regions, it is not necessary to accurately fit the hard mask to the element substrate. Accordingly, it is possible to simplify the manufacturing process.

Electronic Apparatus

Figure 8:
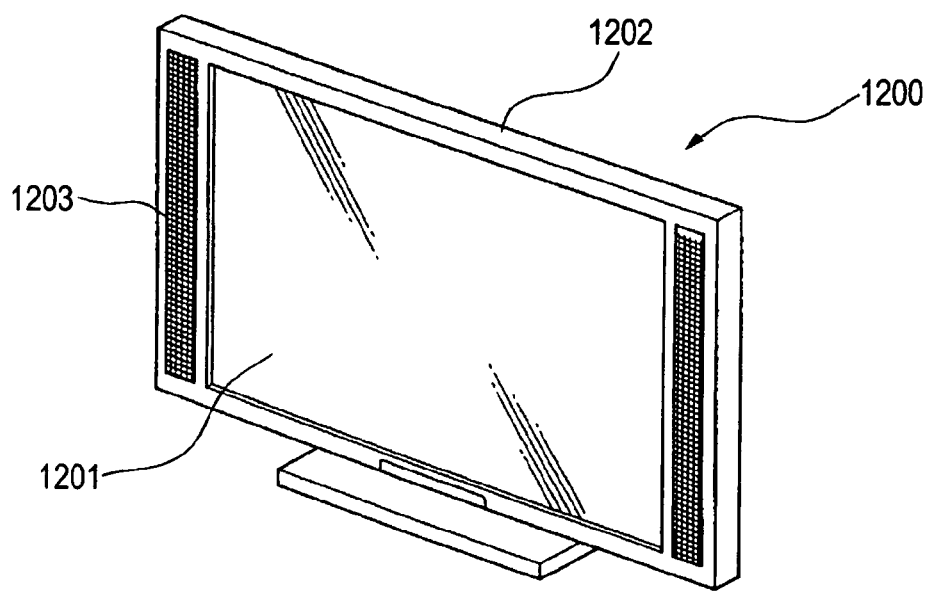
FIG. 8 is a perspective view of a super-slim large-screen television.

FIG. 8 is a perspective view of a super-slim large-screen television (TV) that is an example of an electronic apparatus according to an embodiment of the invention. A super-slim large-screen TV 1200 shown in FIG. 8 includes a display unit 1201, which is composed of the organic EL device according to the embodiment of the invention, a case 1202, and a voice output unit 1203 such as a speaker.

In the large-screen TV 1200, since a plurality of organic EL elements are arranged in a matrix, a significant voltage drop due to the wiring line resistance of the power lines occurs in the organic EL elements located in the central portion of the large-screen TV 1200. In order to prevent the voltage drop due to the wiring line resistance, the power lines are provided in a lattice shape in the large-screen TV 1200. Accordingly, it is possible to prevent short circuits from consecutively occurring in the entire screen by employing the organic EL device according to the above-mentioned embodiment as the display unit 1201. Accordingly, it is possible to provide a reliable large-screen TV.

The organic EL device according to the invention can be applied to a case where the power lines are arranged in a lattice shape or in a stripe shape. In addition, examples of the wiring line described in the invention include control lines, such as scanning lines or data lines, in addition to the power lines. Accordingly, the organic EL device according to the invention can be applied to prevent short circuits between control lines and cathodes from consecutively occurring.

Accordingly, examples of an electronic apparatus equipped with the organic EL device according to the invention include large-screen TVs, digital cameras, personal computers, compact TVs, portable TVs, viewfinder monitor direct view videotape recorders, PDA, portable gaming machines, pagers, electronic notes, electronic calculators, watches, word processors, workstations, video phones, POS terminals, and terminals equipped with touch panel. Further, examples of the electronic apparatus equipped with the organic EL device according to the invention include vehicle display devices, such as a vehicle audio, a vehicle gauge, or a car navigator, and an optical recording head for printers.

The invention is not limited to the above-mentioned embodiments but includes various changes in form and details of the embodiments without departing from the scope of the invention. That is, the invention is not limited to specific materials or configurations described in the above-mentioned embodiments but includes various changes made thereto. For example, although the above-mentioned embodiment has described the bottom emission type organic EL device, the invention may be applied to a top emission type organic EL device.

What is claimed is:

1. An organic EL device comprising:
   first electrodes;
   wiring lines that drive the first electrodes;
   second electrodes that each has a high resistance portion having a resistance higher than other portions of the second electrodes, at least a part of the high resistance portion being arranged to overlap the wiring lines in plan view; and
   a light-emitting layer that is interposed between the first and second electrodes,
   the high resistance portion being formed between pixel regions so as to extend, in plan view, for a first extension length and a second extension length, the first extension length being less than a length of the pixel region and the second extension length being less than the first extension length.

2. The organic EL device according to claim 1, wherein the wiring lines are arranged in a lattice shape.

3. The organic EL device according to claim 1,
   wherein a plurality of the light-emitting layers are arranged, and each of the second electrodes includes a plurality of the high resistance portions; and
   the high resistance portions are provided at the same pitches as those of the plurality of light-emitting layers and are arranged around the light-emitting layers.

4. The organic EL device according to claim 3, wherein the high resistance portions are arranged to overlap intersection portions of the wiring lines arranged in a lattice shape in plan view.

5. The organic EL device according to claim 3, wherein the high resistance portion is formed by opening the second electrode.

6. The organic EL device according to claim 1,
   wherein a plurality of the light-emitting layers are arranged and each of the second electrodes includes a plurality of the high resistance portions; and
   the high resistance portions are arranged at pitches different from those of the plurality of light-emitting layers.

7. The organic EL device according to claim 6, wherein the plurality of high resistance portions are provided extending in a direction that intersects a direction in which the plurality of light-emitting layers extend.

8. The organic EL device according to claim 6, the high resistance portion having a thickness smaller than the thickness of other portions of the second electrode.

9. The organic EL device according to claim 1, wherein at least a portion other than the high resistance portion in the second electrode includes a material having a positive temperature coefficient.

10. An electronic apparatus comprising the organic EL device according to claim 1.

* * * * *